(12) United States Patent
Hirata

(10) Patent No.: US 6,327,185 B1
(45) Date of Patent: Dec. 4, 2001

(54) SEMICONDUCTOR MEMORY APPARATUS WHICH CAN MAKE READ SPEED OF MEMORY CELL FASTER

(75) Inventor: Masayoshi Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/638,310

(22) Filed: Aug. 16, 2000

(30) Foreign Application Priority Data

Sep. 6, 1999 (JP) .................................................. 11-251399

(51) Int. Cl.⁷ .................................................... G11C 16/06
(52) U.S. Cl. ..................................... 365/185.2; 365/185.21
(58) Field of Search ........................... 365/185.21, 185.2, 365/185.25, 185.01

(56) References Cited

U.S. PATENT DOCUMENTS

| 4,933,906 | * | 6/1990 | Terada et al. | 365/185.21 |
| 5,022,003 | | 6/1991 | Kohno | 365/189.01 |
| 5,255,233 | | 10/1993 | Izumi | 365/207 |
| 5,946,238 | * | 8/1999 | Campardo et al. | 365/185.2 |
| 5,982,666 | * | 11/1999 | Campardo | 365/185.21 |
| 5,986,937 | * | 11/1999 | Yero | 365/185.11 |

FOREIGN PATENT DOCUMENTS

| 5-266675 | 10/1993 | (JP) . |
| 6-325577 | 11/1994 | (JP) . |
| 7-334998 | 12/1995 | (JP) . |
| 8-96582 | 4/1996 | (JP) . |
| 8-147991 | 6/1996 | (JP) . |

* cited by examiner

Primary Examiner—Hoai V. Ho
(74) Attorney, Agent, or Firm—Sughrue, Mion, Zinn, Macpeak & Seas, PLLC

(57) ABSTRACT

A semiconductor memory apparatus including a current detecting circuit, an input signal generating circuit, a reference current detecting circuit, a reference input signal generating circuit and a differential amplifier circuit. The current detecting circuit detects a current flowing through a memory cell to output a detecting signal from an output section of the current detecting circuit. The input signal generating circuit generates a first differential input signal by amplifying the detecting signal to output from an output section of the input signal generating circuit. The reference current detecting circuit detects a current flowing through a reference cell to output a reference detecting signal from an output section of the reference current detecting circuit. The reference input signal generating circuit generates a second differential input signal by amplifying the reference detecting signal to output from an output section of the reference input signal generating circuit. The differential amplifier circuit detects a voltage difference between the first and second differential input signals.

20 Claims, 7 Drawing Sheets

Fig. 6A
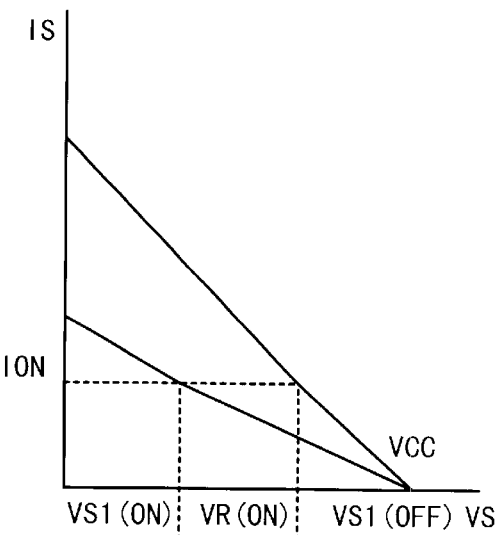
Fig. 6B
Fig. 6C
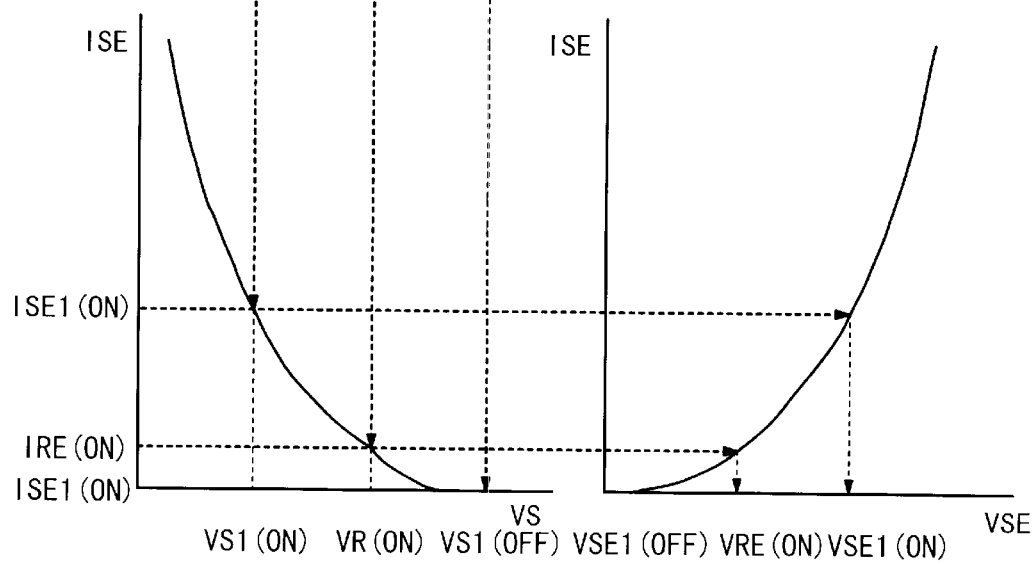

SEMICONDUCTOR MEMORY APPARATUS WHICH CAN MAKE READ SPEED OF MEMORY CELL FASTER

BACKGROUND OF THE INVENTION

1. Field of the Invention

The present invention relates to a semiconductor memory apparatus which can make a read speed of a memory cell faster. Especially, the present invention relates to a semiconductor memory apparatus which can make a read speed of a memory cell faster by using a sense amplifier having an input signal generator for generating an input signal to a differential amplifier circuit and a current detector for detecting a current flowing through a memory cell, in an ON/OFF judgment of a memory cell voltage.

2. Description of the Related Art

In a conventional sense amplifier, a circuit for reading out a main memory cell is designed such that an output terminal of a current detector to which the main memory cell is connected is connected to one input terminal of a differential amplifier circuit and an output terminal of a reference current detector to which a reference cell is connected is connected to the other input terminal of the differential amplifier circuit.

In the conventional read circuit, as shown in FIGS. 1 and 2, an output signal VSi (i=1, 2, . . . , n) of a main memory cell current detector connected to a main memory cell Mi (i=1, 2, . . . , n) is inputted to one input terminal of the differential amplifier circuit, and an output signal VR of a reference current detector connected to the reference cell is inputted to the other input terminal of the differential amplifier circuit.

In the current detectors, in order to detect micro currents flowing through the main memory cell and the reference cell, resistances of resistors Ri (i=1, 2, . . . , n) and RR1 and RR2 are set to be large to then obtain a margin for differential input signals inputted to the differential amplifier circuit when the reading-out operation is done.

Thus, parasitic capacities Ci (i=1, 2, . . . , n) and CR existing on input signal lines of the differential amplifier circuit are viewed as being large. Hence, there are limitations on reductions of times until the signals VSi (i=1, 2, . . . , n) and VR reach desired voltages, respectively. In addition, since the parasitic capacity CR is greater than the parasitic capacity Ci, as shown in FIG. 2, an actual rise of a reference voltage VRR becomes slower than a rise of an ideal reference voltage VRI (similar to an approximately average of an ON cell voltage VSON and an OFF cell voltage VSOF). Hence, a time t2 to take for the VRR to exceed the ON cell voltage VSON becomes longer to thereby make a read speed of an ON cell signal slower.

The conventional semiconductor memory apparatus having the read circuit has a limitation on a read speed of an ON cell signal. Thus, there is a limit in improving a performance of the semiconductor memory apparatus Itself. According to the above-mentioned consideration, this reason is as follows. That is, since the output terminal of the current detector is directly connected to the input terminal of the differential amplifier circuit, it is difficult to improve a rise performance of a detection signal applied to the input terminal. Hence, there is the limit in improving the read speed of the ON cell signal.

Therefore, an object of the present invention is to provide a semiconductor memory apparatus for improving such rise performance.

By the way, Japanese Laid Open Patent Application (JP-A-Heisei, 8-147991) discloses the following semiconductor memory apparatus. It is provided with: first and second current sensing circuits, each of which contains a first conductive type of a first MOSFET that is mounted between a first power supply voltage and its output node and has a relatively small conductance; a differential amplifier circuit in which its non-inversion and inversion input nodes are coupled to each output node of the first and second current sensing circuits and then they are selectively made active in accordance with a first inner control signal; and a sense amplifier containing second and third MOSFETs of the first conductive type, each of which is mounted parallel to the first MOSFETs constituting the first and second current sensing circuits and has a relatively large conductance and is transiently turned on immediately before the differential amplifier circuit is made active.

Japanese Laid Open Patent Application (JP-A-Heisei, 7-334998) discloses the following semiconductor memory apparatus. In the semiconductor memory apparatus provided with: a memory apparatus array for storing a data; an address buffer for capturing an address to select the data in this memory apparatus array; and a data sensing circuit for reading out a data on a selection bit line of the memory apparatus array, the data sensing circuit has: clock synchronization sense amplifiers in a plurality of systems in which input terminals are commonly connected to the selection bit line to thereby carry out a time sharing operation; and a selector for selectively outputting the data stored by those sense amplifiers. Each clock synchronization sense amplifier has: a pre-sensing circuit selectively connected to the selection bit line under the control of a synchronization clock; and a main sensing circuit for capturing and latching an output from the presensing circuit under the control of the synchronization clock.

Japanese Laid Open Patent Application (JP-A-Heisei, 8-96582) discloses the following semiconductor memory apparatus. This is a semiconductor memory apparatus for detecting a potential of a memory cell connected to a bit line from a potential of the bit line, and it is provided with: an applying unit for applying to the bit line a predetermined potential to pre-charge the memory cell; an output unit for receiving a detection signal based on the applied potential and then outputting its inversion signal as an output of the semiconductor memory apparatus; and a controller for controlling the potential to pre-charge the memory cell in accordance with the inversion signal.

Japanese Laid Open Patent Application (JP-A-Heisei, 6-325577) discloses the following semiconductor memory apparatus. That is, it is provided with: first and second bit lines; a plurality of columns composed of a plurality of memory cells designed such that first and second data input output terminals are respectively connected to those first and second bit lines, and if it is selected when a read operation is done, a current flows from any of the first and second data input output terminals in accordance with a data to be stored; first and second connection switch devices, in which they are mounted correspondingly to each of the plurality of columns, and respective first ends are connected to the first and second bit lines, and they are controlled so as to be turned on and off in accordance with a column selection signal; first and second common data lines which are mounted correspondingly to the plurality of columns, and respectively connected to second ends of the first and second connection switch devices; and a sense amplifier for detecting the current flowing through the first and second common data lines when the read operation is done, and accordingly detecting the data to be stored by the selected memory cell, the sense amplifier is designed such that when the read operation is done, a voltage of the first common data line is correlated to a voltage at a voltage detection point on the second common data line side for the sake of data detection and then a voltage of the second common data line is correlated to a voltage at a voltage detection point on the first common data line side for the sake of data detection.

Japanese Laid Open Patent Application (JP-A-Heisei, 5-266675) discloses the following semiconductor memory apparatus. In the semiconductor memory apparatus having a memory cell, a pair of bit lines, a bit selector, a pair of common data lines, a writing unit and a sense amplifier, the reading unit is provided with: a pair of transistors, each of which has a collector connected through a loading unit to a second power supply and an emitter connected to the pair of common data lines and is driven in response to the read signal; and a differential amplifier for connecting respective inputs to the collectors of the pair of transistors and then detecting a difference between the inputted mutual potentials.

SUMMARY OF THE INVENTION

The present invention is accomplished in view of the above mentioned problems. Therefore, an object of the present invention is to provide a semiconductor memory apparatus that can make a read speed of a memory cell faster.

In order to achieve an aspect of the present invention, a semiconductor memory apparatus, includes: a current detecting circuit detecting a current flowing through a memory cell to output a detecting signal from an output section of the current detecting circuit; an input signal generating circuit generating a first differential input signal obtained by amplifying the detecting signal to output from an output section of the input signal generating circuit; a reference current detecting circuit detecting a current flowing through a reference cell to output a reference detecting signal from an output section of the reference current detecting circuit; a reference input signal generating circuit generating a second differential input signal obtained by amplifying the reference detecting signal to output from an output section of the reference input signal generating circuit; and a differential amplifier circuit detecting a voltage difference between the first and second differential input signals.

In this case, the input signal generating circuit and the reference input signal generating circuit have a high current supply performance.

Also in this case, the input signal generating circuit transforms the detecting signal into the first differential input signal having a higher rising performance than the detecting signal, and the reference input signal generating circuit transforms the reference detecting signal into the second differential input signal having a higher rising performance than the reference detecting signal.

In order to achieve another aspect of the present invention, a semiconductor memory apparatus, further includes: a plurality of first differential input signal generating circuits of N (N is an integer grater than or equal to 1), wherein each of the plurality of first differential input signal generating circuits includes the memory cell, the current detecting circuit, and the input signal generating circuit; and a plurality of the differential amplifier circuits of the N, and wherein one input sections of the plurality of differential amplifier circuits input a plurality of the first differential input signals outputted from a plurality of the input signal generating circuits, respectively and the other input sections of the plurality of differential amplifier circuits input the second differential input signal, and the semiconductor memory apparatus is a sense amplifier of the N channel.

Further in this case, the input signal generating circuit includes: a first transistor, a first electrode of the first transistor being connected to a first power supply and a second electrode of the first transistor being connected to the output section of the input signal generating circuit and a control electrode of the first transistor being connected to the output section of the current detecting circuit; and a second transistor,. a first electrode of the second transistor being a second power supply and second and control electrodes of the second transistor being connected to the output section of the input signal generating circuit, and wherein the second electrode of the first transistor is connected to the second electrode of the second transistor.

In this case, the first transistor is a P-channel enhancement transistor and the first electrode is a source and the second electrode is a drain and the control electrode is a gate, and the second transistor is a N-channel enhancement transistor.

Also in this case, the reference input signal generating circuit includes: a third transistor, a first electrode of the third transistor being connected to a third power supply and a second electrode of the third transistor being connected to the output section of the reference input signal generating circuit and a control electrode of the third transistor being connected to the output section of the reference current detecting circuit; and a fourth transistor, a first electrode of the fourth transistor being connected to a fourth power supply and second and control electrodes of the fourth transistor being connected to the output section of the reference input signal generating circuit, and wherein the second electrode of the third transistor is connected to the second electrode of fourth transistor.

Further in this case, the third transistor is a P-channel enhancement transistor and the first electrode is a source and the second electrode is a drain and the control electrode is a gate, and the fourth transistor is a N-channel enhancement transistor.

In this case, the input signal generating circuit includes: a fifth transistor, a first electrode of the fifth transistor being connected to a fifth power supply and a second electrode of the fifth transistor being connected to the output section of the input signal generating circuit and a control electrode of the fifth transistor being connected to the output section of the current detecting circuit; and a sixth transistor, a first electrode of the sixth transistor being a sixth power supply and a second electrodes of the sixth transistor being connected to the output section of the input signal generating circuit and a control electrode of the sixth transistor being connected to the output section of the current detecting circuit, and wherein the second electrode of the fifth transistor is connected to the second electrode of the sixth transistor.

Also in this case, the fifth transistor is a P-channel enhancement transistor and the first electrode is a source and the second electrode is a drain and the control electrode is a gate, and the sixth transistor is a N-channel enhancement transistor.

Further in this case, the reference input signal generating circuit includes: a seventh transistor, a first electrode of the seventh transistor being connected to a seventh power supply and a second electrode of the seventh transistor being connected to the output section of the reference input signal generating circuit and a control electrode of the seventh transistor being connected to the output section of the reference current detecting circuit; and a eighth transistor, a first electrode of the eighth transistor being connected to a eighth power supply and a second electrodes of the eighth transistor being connected to the output section of the reference input signal generating circuit and a control electrode of the fourth transistor being connected to the output section of the reference current detecting circuit, and wherein the second electrode of the seventh transistor is connected to the second electrode of eighth transistor.

In this case, the seventh transistor is a P-channel enhancement transistor and the first electrode is a source and the second electrode is a drain and the control electrode is a gate, and the eighth transistor is a N-channel enhancement transistor.

Also in this case, the semiconductor memory apparatus is applied to a flash memory.

Further in this case, the current detecting circuit includes: a first resistor, one end of the first resistor being connected to a ninth power supply and the other end of the first resistor being connected to the output section of the current detecting circuit; a ninth transistor, a first electrode of the ninth transistor being connected to a first node connected to the memory cell and a second electrode of the ninth transistor being connected to the output section of the current detecting circuit; and a first inverter inputting a voltage of the first node to output to the control electrode of the ninth transistor.

In this case, the ninth transistor is a N-channel enhancement transistor.

Also in this case, the reference current detecting circuit includes: second and third resistors provided in parallel, one ends of the second and third resistors being connected to a tenth power supply and the other ends of the second and third resistors being connected to the output section of the reference current detecting circuit; a tenth transistor, a first electrode of the tenth transistor being connected to a second node connected to the reference cell and a second electrode of the tenth transistor being connected to the output section of the reference current detecting circuit; and a second inverter inputting a voltage of the second node to output to the control electrode of the tenth transistor.

Further in this case, the tenth transistor is a N-channel enhancement transistor.

In this case, the input signal generating circuit and the reference input signal generating circuit generate the first and second differential input signals such that a predetermined sense margin of the voltage difference is obtained at high speed.

Also in this case, the differential amplifier circuit inputs the first and second differential input signals through input signal lines from the input signal generating circuit and the reference input signal generating circuit, the input signal lines having parasitic capacities and wherein the input signal generating circuit and the reference input signal generating circuit have a high current supply performance such that the first and second differential input signals reach predetermined voltages at high speeds while charging the parasitic capacities.

Further in this case, the reference input signal generating circuit includes: a third transistor, a first electrode of the third transistor being connected to a third power supply and a second electrode of the third transistor being connected to the output section of the reference input signal generating circuit and a control electrode of the third transistor being connected to the output section of the reference current detecting circuit; and a fourth transistor, a first electrode of the fourth transistor being connected to a fourth power supply and second and control electrodes of the fourth transistor being connected to the output section of the reference input signal generating circuit, and wherein the second electrode of the third transistor is connected to the second electrode of fourth transistor.

In a semiconductor memory apparatus according to the present invention, an input signal generator for generating an input signal of a differential amplifier circuit from an output signal of a current detector is added to a sense amplifier, in order that an output terminal of a current detector of the reference cell or the main memory cell is not directly connected to an input terminal of the differential amplifier circuit. Thus, it is possible to attain the design optimal for the sense amplifier by improving only the performance of the current detection with regard to the current detector and then considering only the improvement of the current supply performance with regard to the input signal generator. Especially, by improving the current supply performance, it is possible to reduce a time required for a voltage of the input signal applied to the input terminal of the differential amplifier circuit to reach a predetermined level and accordingly make a read speed of a memory cell faster.

The above-mentioned configuration enables an input signal generator 21 and a reference input signal generator 2R to convert detection signals VS1, VR of current detectors 11, 1R into a first differential input signal VSE1 and a second differential input signal VRE in which rise performances are excellent. Thus, the performance of the output signal from the differential amplifier circuit is improved over that of the conventional sense amplifier.

A semiconductor memory apparatus according to the present invention further uses as an input signal generator $2i$ a circuit designed such that a P-type enhancement transistor TPAi (i=1, 2, ..., n), in which a power supply terminal is connected to a source, an output terminal of an input signal generator $2i$ (i=1, 2, ..., n) is connected to a drain and an output terminal of a current detector $1i$ (i=1, 2, ..., n) is connected to a gate, and an N-type enhancement transistor TNAi (i=1, 2, ..., n), in which a ground power supply terminal is connected to a source and an output terminal of an input signal generator $2i$ is connected to a drain and a gate, are connected to each other through the respective drains, and uses as a reference input signal generator 2R a circuit designed such that a P-type enhancement transistor TPAi, in which a power supply terminal is connected to a source, an output terminal of a reference input signal generator 2R is connected to a drain and an output terminal of a reference current detector 1R is connected to a gate, and an N-type enhancement transistor TNAR, in which a ground power supply terminal is connected to a source and an output terminal of a reference input signal generator 2R is connected to a drain and a gate, are connected to each other through the respective drains. Hence, this can make a read speed of a memory cell faster.

A semiconductor memory apparatus according to the present invention further uses as an input signal generator $2i$ a circuit designed such that a P-type enhancement transistor TPAi, in which a power supply terminal is connected to a source, an output terminal of an input signal generator $2i$ (i=1, 2, ..., n) is connected to a drain, and an output terminal of a current detector $1i$ (i=1, 2, ..., n) is connected to a gate, and an N-type enhancement transistor TNAi, in which a ground power supply terminal is connected to a source, an output terminal of an input signal generator $2i$ is connected to a drain, and an output terminal of the current detector 1*i* is connected to a gate, are connected to each other through the respective drains, and uses as a reference input signal generator 2R a circuit designed such that a P-type enhancement transistor TPAR, in which a power supply terminal is connected to a source, an output terminal of a reference input signal generator 2R is connected to a drain, and an output terminal of a reference current detector 1R is connected to a gate, and an N-type enhancement transistor TNAi, in which a ground power supply terminal is connected to a source, an output terminal of a reference input signal generator 2R is connected to a drain, and an output terminal of the reference current detector 1R is connected to a gate, are connected to each other through the respective drains. Hence, this can make a read speed of a memory cell much faster.

A read circuit of the semiconductor memory apparatus has a unit for charging an input voltage of a differential amplifier circuit to a desirable voltage at a high speed when a sense amplifier is actuated. It is divided into a current detector for detecting a current flowing through a memory cell and an input signal generator for generating an input signal to the differential amplifier circuit. Then, a signal detected by the current detector is amplified by the input signal generator having a high current supply performance, and outputted to the differential amplifier circuit. Thus, it is possible to charge to the desirable voltage at the high speed.

BRIEF DESCRIPTION OF THE DRAWINGS

FIG. 6A is a graph showing a relation between an output value and an input value of an ON/OFF cell in a current dector;

FIG. 6B is a graph showing another relation between an output value and an input value of an ON/OFF cell in a current detector;

FIG. 6C is a graph showing still another relation between an output value and an input value of an ON/OFF cell in a current detector.

DESCRIPTION OF THE PREFERRED EMBODIMENTS

An embodiment of a semiconductor memory apparatus in the present invention will be described below in detail with reference to the attached drawings.

Figure 3:
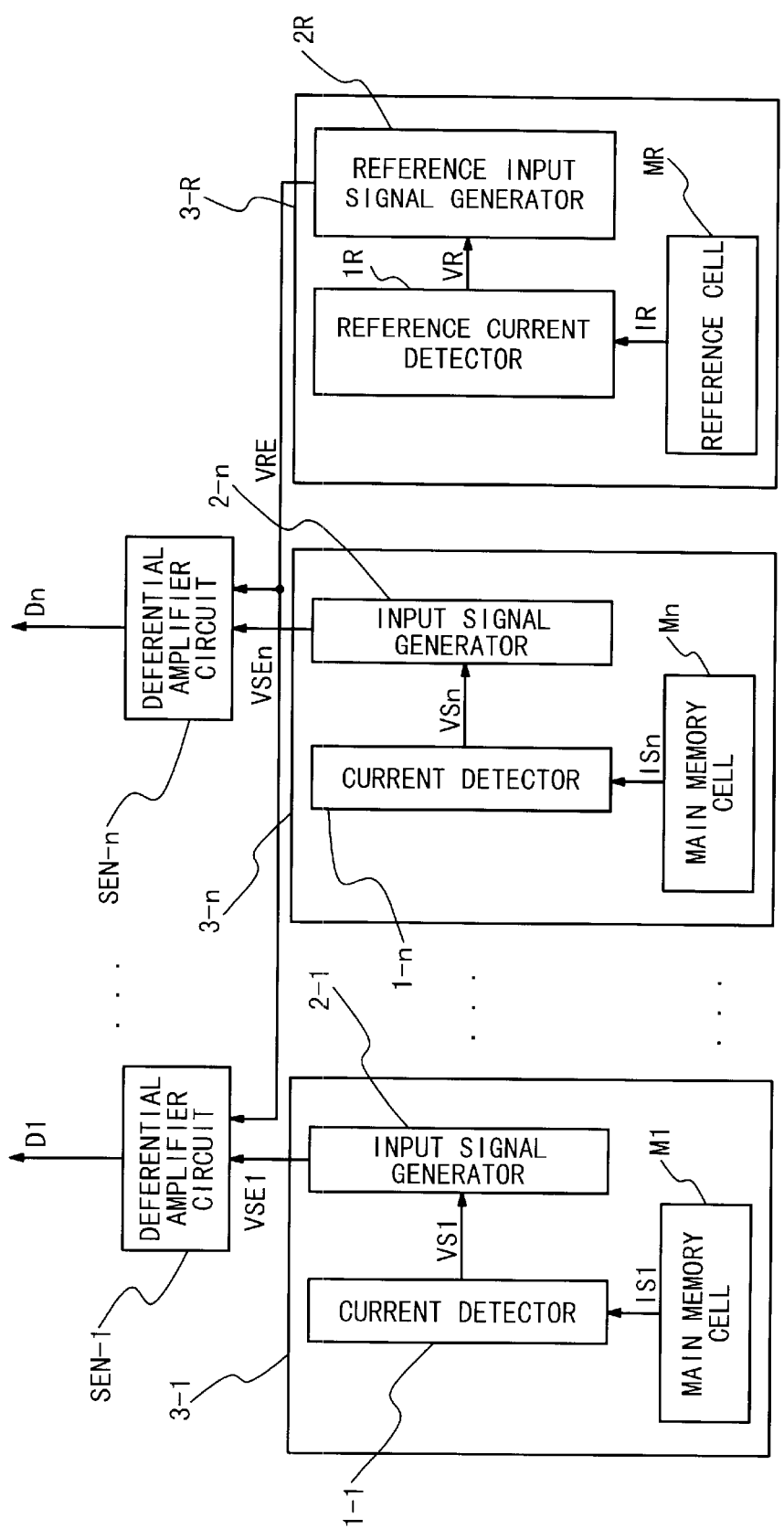
FIG. 3 is a circuit diagram showing an embodiment of a semiconductor memory apparatus according to the present invention.

As shown in FIG. 3, sense amplifiers of n channels are mounted in a semiconductor memory apparatus according to the present invention. In the sense amplifiers of the n channels, channel numbers are denoted by i (i=1, 2, ..., n).

The sense amplifiers of the n channels have first differential input signal generating circuits 3-*i* of the n, and a second differential input signal generating circuit 3-R, and differential amplifier circuits SEN-i of the n. Each of the n first differential input signal generating circuits 3-*i* includes a main memory cell Mi, a current detector 1-*i* and an input signal generator 2-*i*. The second differential input signal generating circuit 3-R includes a reference cell MR, a reference current detector 1R and a reference input signal generator 2R. It is possible to mount a plurality of the second differential input signal generating circuits 3-R.

Figure 1:
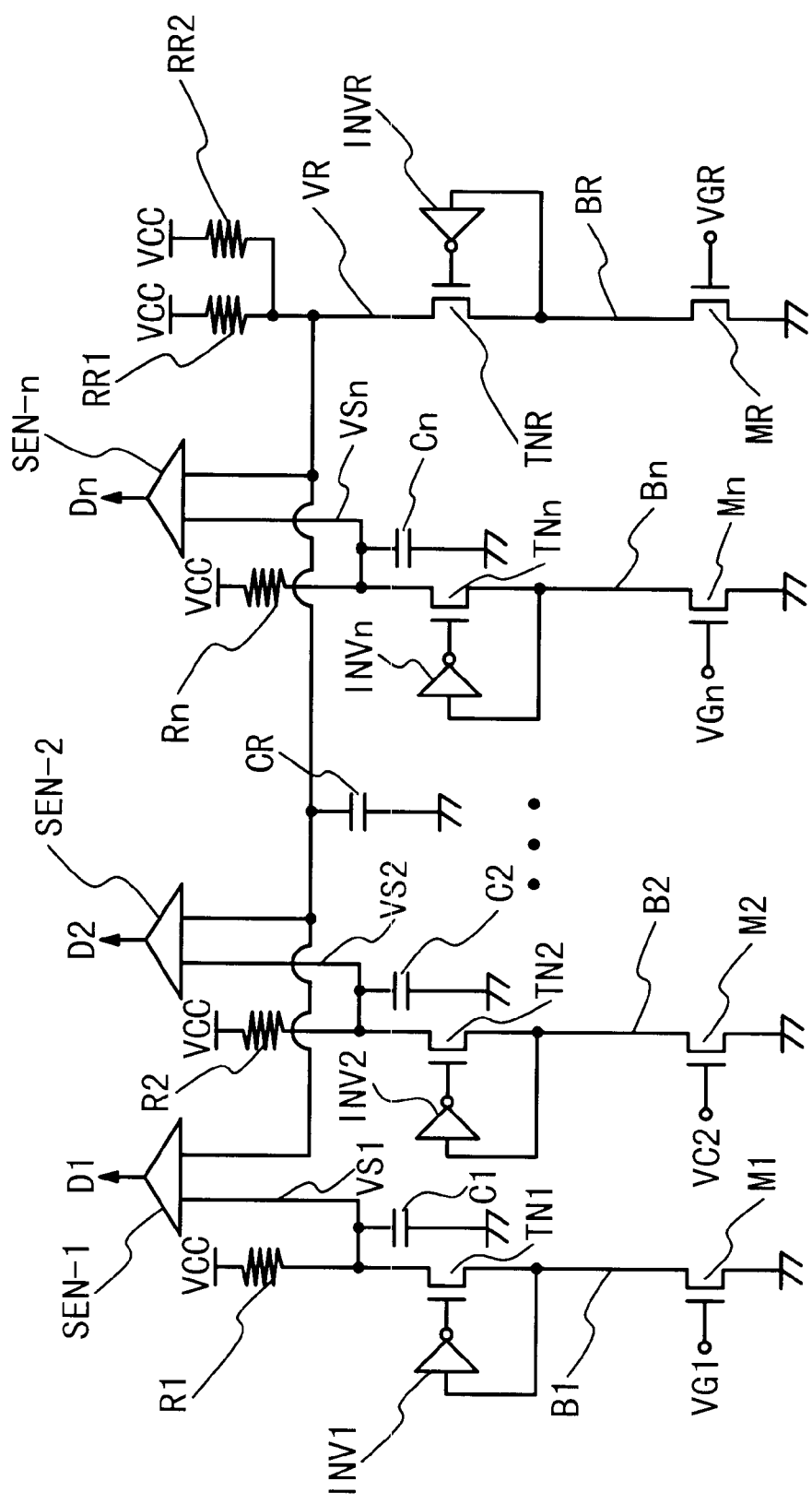
FIG. 1 a circuit diagram showing an electric circuit of a conventional semiconductor memory apparatus.
Figure 2:
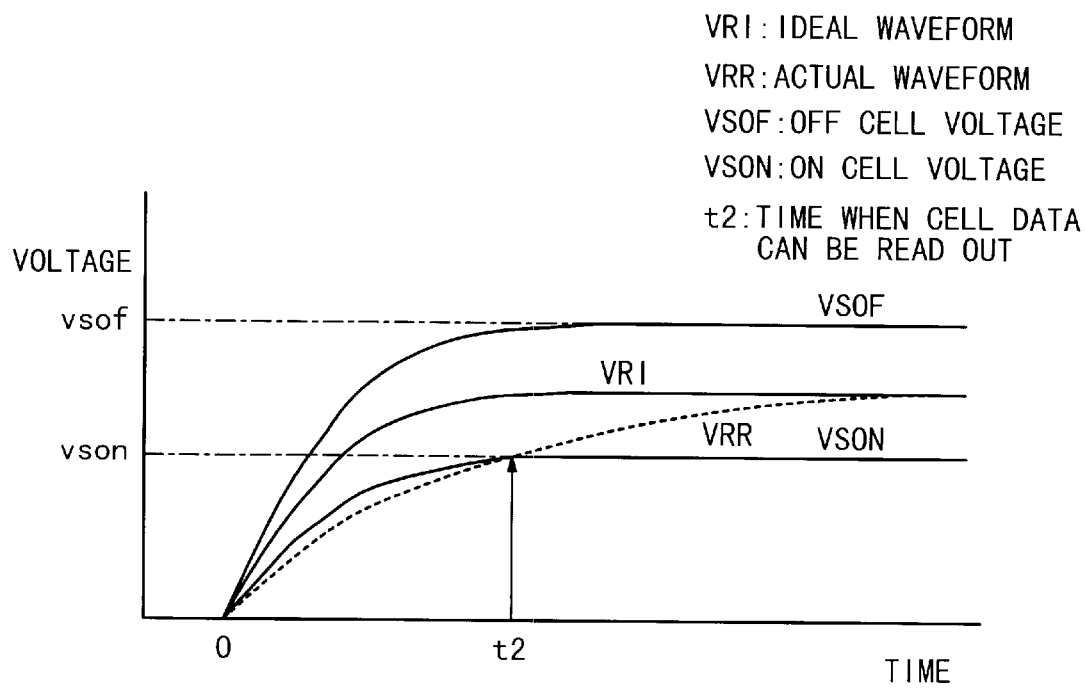
FIG. 2 is a graph showing a relation between a readable time and a transition of an input voltage when an ON/OFF judgment of a memory cell of the conventional semiconductor memory apparatus is done.
Figure 4:
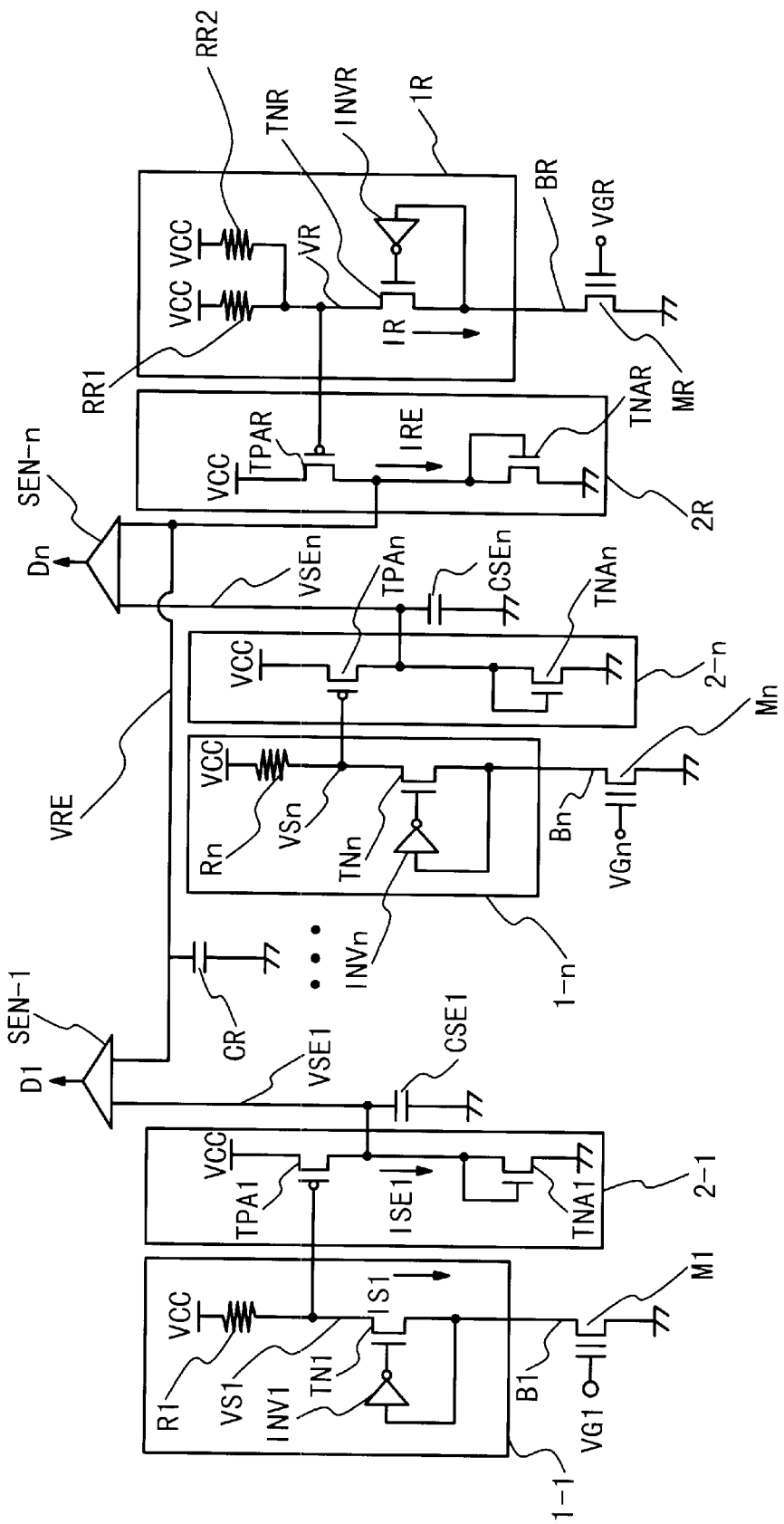
FIG. 4 is a circuit diagram showing in detail the circuit in FIG. 3.

In a semiconductor memory apparatus shown in FIG. 4, the embodiment shown in FIG. 3 is applied to a read out circuit of a flash memory. In FIG. 4, 1-1 and 1-*n* denote current detectors corresponding to main memory cells M2 and Mn, respectively. 1R denotes a current detector corresponding to the reference cell MR. 2-1 and 2-*n* denote input signal generators on the main memory cell side. And, 2R denotes a reference input signal generator on the reference cell side. Each of the first differential input signal generating circuit 3-*i* (refer to FIG. 3) for generating a first differential input signal VSEi and the second differential input signal generating circuit 3-R (refer to FIG. 3) for generating a second differential input signal VRE includes the current detector for detecting a current flowing through the cell and the input signal generator for generating an input signal supplied to the differential amplifier circuit SEN-i.

Signals Vsi, VR detected by the current detectors 1-*i*, 1R are inputted to respective gates of transistors TPAi, TPAR of the input signal generators 2-*i*, 2R having relatively small capacities, and their currents are amplified. Signals VSEi, VRE amplified by the input signal generators 2-*i*, 2R are signals having high current supply performances. The signals VSEi, VRE reach desirable voltages at high speeds while charging relatively large parasitic capacities CSEi, CR on input signal lines of the differential amplifier circuits SEN-i. Thus, it is possible to read out an expectation value in the memory cell at a high speed.

As shown in FIG. 4, the sense amplifier of the first channel has the memory cell M1. In the memory cell M1, a terminal VG1 is connected to a gate thereof, and a terminal line B1 is connected to a drain thereof. The sense amplifier of the first channel has the reference cell MR. In the reference cell MR, a terminal VGR is connected to a gate thereof, and a terminal line BR is connected to a drain thereof. The reference cell MR can generate a reference voltage at the drain thereof.

The terminal B1 is connected to the current detector 1-1. The current detector 1-1 outputs the detection signal VS1 which is a current, if the main memory cell M1 is turned ON or OFF. The terminal BR is connected to the reference current detector 1R. The reference current detector 1R outputs the detection signal VR which is a current, if the reference cell MR is turned ON.

The current detector 1-1 includes a resistor R1, an N-type enhancement transistor TN1, and an inverter INV1. In the resistor R1, one end is connected to a current supply power source VCC and the other end is connected to the output terminal VS1. In the N-type enhancement transistor TN1, one of a source and a drain is connected to the terminal B1 and the other one is connected to the output terminal VS1. A voltage of the terminal B1 is inputted to the inverter INV1 and an output of the inverter INV1 is connected to a gate of the transistor TN1.

The input signal generator 2-1 to which the signal VS1 outputted by the current detector 1-1 is inputted outputs a signal VSE1 in which the current is amplified. The reference input signal generator 2R to which the signal VR outputted by the reference current detector 1R is inputted outputs a signal VRE in which the current is amplified. A differential voltage D1 between the signal VSE1 and the signal VRE is outputted by a differential amplifier circuit SEN-1. The reference current detector 1R includes two resistors RR1, RR2, an N-type enhancement transistor TNR and an inverter INVR. In the two resistors RR1, RR2, one ends are connected to the current supply power supply VCC and the other ends are connected to the output terminal VR. In the N-type enhancement transistor TNR, one of a source and a drain is connected to the terminal BR and the other one is connected to the output terminal VR. The inverter INVR inputs the voltage of the terminal BR and an output of the inverter INVR is connected to a gate of the transistor TNR.

The input signal generator 2-1 includes a P-type enhancement transistor TPA1 and an N-type enhancement transistor TNA1. In the P-type enhancement transistor TPA1, a source thereof is connected to the power supply terminal VCC, a drain thereof is connected to an output terminal line transmitting the signal VSE1 and a gate thereof is connected to the output terminal line VS1 of the current detector 1-1. In the N-type enhancement transistor TNA1, a drain thereof and a gate thereof are connected to the output terminal VSE1 and a source thereof is connected to the GND power supply.

The reference input signal generator 2R includes a P-type enhancement transistor TPAR and an N-type enhancement transistor TNAR. In the P-type enhancement transistor TPAR, a source thereof is connected to the power supply terminal VCC, a drain thereof is connected to an output terminal outputting the signal VRE and a gate thereof is connected to the output terminal line VR of the reference current detector 1R. In the N-type enhancement transistor TNAR, a drain thereof and a gate thereof are connected to the output terminal VRE and a source thereof is connected to the GND power supply.

Figure 5:
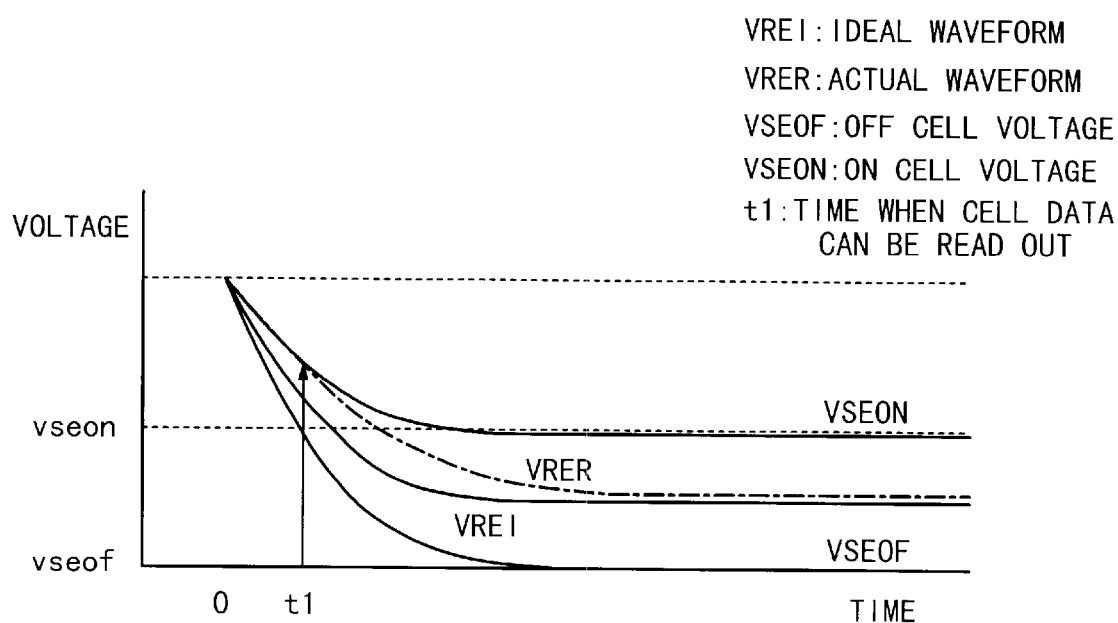
FIG. 5 is a graph showing a relation between a readable time and a transition of an input voltage of a differential amplifier circuit.

FIG. 5 shows the temporal changes in the voltages of the input signal VRE and the input signal VSE1 to the differential amplifier circuit SEN-1. When the reading-out operation is started (T=0), the bit lines B1, BR begin the operations from a GND level. At this time, the voltages at the terminals VS1, VR are very low. Therefore, the P-type enhancement transistors TPA1, TPAR in which that terminal voltages VS1, VR are inputted to their gates respectively are sufficiently conducted to thereby raise the output terminal lines VSE1, VRE up to the power supply voltage VCC. At this time, currents ISE1, IRE of the input signal generators are cut off from the GND power supply so that they do not flow (this function is not shown).

When the reading-out operation is started, the memory cells M1, MR begin to send predetermined currents. The voltages of the terminal lines VS1, VR at this time are shown in FIGS. 6A, 6B and 6C. The terminal lines VS1, VR are changed as shown in FIG. 6A. The reason why inclinations of the graphs are different is that resistances of load resistors are different with each other. (Since two resistors on the reference side are connected parallel to each other, and the resistances of them are small, the inclination of the graph is made sharper).

Thus, even if ON current values ION of the memory cells are same with each other, the output terminal VS1 and the terminal VR obtain voltages different from each other. If the main memory cell is at an ON state, the output terminal VS1 obtains a voltage VS1 (ON). If the main memory cell is at an OFF state, the output terminal VS1 obtains a voltage VS1 (OFF). Also, the output terminal VR on the reference side obtains a voltage VR (ON).

At this time, the output terminal VS1 and the terminal VR are connected only to the gates of the P-type enhancement transistors TPA1, TPAR in the input signal generators 2-1, 2R and micro currents drive the P-type enhancement transistors TPA1, TPAR, respectively. Irrespectively of the fact, the voltages are quickly changed. The P-type enhancement transistors TPA1, TPAR in which the gate voltages are controlled control the currents ISE1, IRE, as shown in FIG. 6B.

Current value of the currents ISE1, IRE at this time is set to be greater than the currents IS1, IR flowing through the memory cells (for example, 10 times). If the main memory cell M1 is at the ON state, the current ISE1 becomes a current ISE1 (ON). If the main memory cell M1 is at the OFF state, the current ISE1 becomes zero. Also, the current IRE on the reference side becomes a current IRE (ON). At this time, voltages at the output terminals VSE1, VRE are determined as shown in the graph of FIG. 6C. If the main memory cell M1 is at the ON state, the voltage of the output terminal VSE1 becomes VSE1 (ON). If the main memory cell M1 is at the OFF state, the voltage of the output terminal VSE1 becomes VSE1 (OFF). Also, the voltage of the output terminal VR on the reference side becomes VRE (ON).

At this time, large parasitic capacities CSE1, CR are present in the input terminals of the differential amplifier circuit SEN-1. However, the input signal generators 2-1, 2R having the high current supply performances quickly shift the voltages at the input terminals to predetermined voltages. Such circuit configuration enables the signal transitions in the signals VSE1, VRE inputted to the differential amplifier circuit SEN-1 to be made faster, and also enables the quick reservation of a sense margin in a voltage difference between a differential input voltage VRER on the reference side and a voltage VSEON or VSEOF on the main memory cell side. That is, it is possible to quickly read out to thereby improve the rise performance. This effect is shown in FIG. 5.

An actual waveform VRER (indicated by an alternate long and short dash line) of the differential input voltage on the reference side is different from an ideal waveform VREI (indicated by a solid line). So, a point is delayed at which it can be judged that an ON cell voltage VSEON becomes higher than the waveform VRER if the rise performance of the waveform VRER is dropped. For this reason, it is necessary to set the sense margin to be large for a voltage difference from a voltage VSE ON or VSE OFF on the main memory cell side. That is, T=t1 at a point at which the sense margin is sufficient for the voltage difference of the first and second differential input signals. The differential amplifier circuit can not output a memory cell data from a terminal D1 by correctly reading out an expectation value of the memory cell, unless after that time t1. Thus, if the voltage difference of the first and second differential input signals can be sufficiently obtained to thereby improve the rise performance, it is possible to reduce a necessary time t1 until the reading-out operation to thereby make the read speed of the memory cell faster.

As mentioned above, the current detector for detecting the current flowing through the memory cell and the input signal generator for generating the input signal to the differential amplifier circuit are provided. Then, the signal detected by the current detector is amplified by the input signal generator having the high current supply performance to be outputted to the differential amplifier circuit. Thus, it is possible to charge to the desirable voltage at the high speed, and also possible to achieve the semiconductor memory apparatus for improving the read speed of the memory cell.

Figure 7:
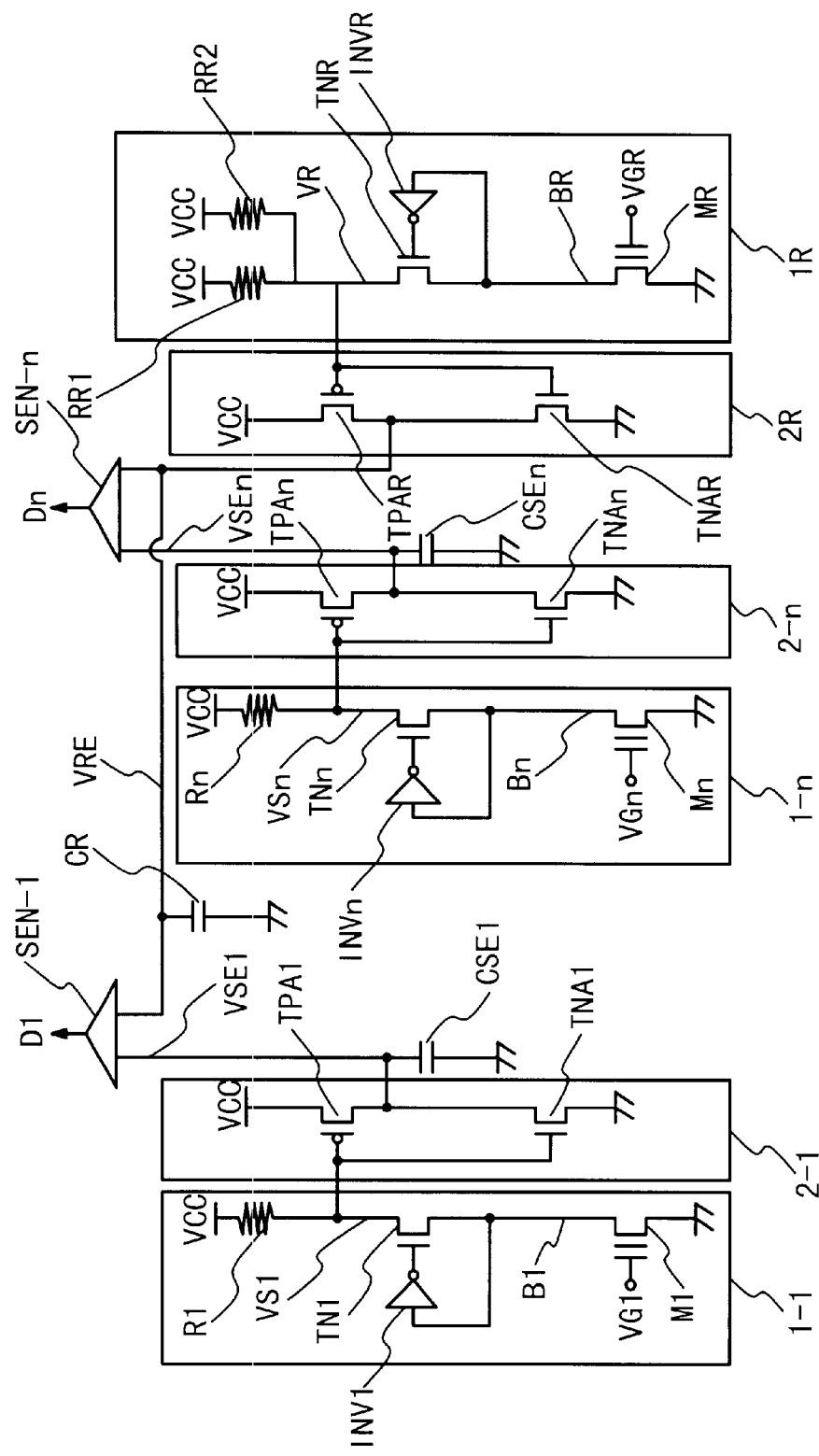
FIG. 7 is a circuit diagram showing another embodiment of a semiconductor memory apparatus according to the present invention.

FIG. 7 shows another embodiment of a semiconductor memory apparatus according to the present invention. The difference from the existing embodiment in this embodiment lies in fact that the gates of the N-type enhancement transistors TNAi, TNAR in the input signal generators 2-i, 2R are connected to the output sides of the current detectors 1-i, 1R. The operations of both the embodiments are approximately similar to each other. This embodiment is disadvantageous in fact that the gate capacitors of the N-type enhancement transistors TNAi, TNAR are viewed from the output terminals of the current detectors 1-i, 1R. However, the circuits of the input signal generators 2-i, 2R are constituted by inverter connection. A voltage amplification factor is higher than that of the former embodiment. Thus, a quick response can be obtained even by a micro voltage change at the output terminals of the current detectors 1-i, 1R. Also, instead of the N-type enhancement transistors TNAi, TNAR, resistors may be used in which one ends are connected to the output terminals VSE1, VSEn and VRE and the other ends are connected to the GND terminal.

In the semiconductor memory apparatus according to the present invention, the input signal generator is provided between the current detector and the differential amplifier circuit. Thus, the large current can be added to the parasitic capacitance on the input signal line of the differential amplifier circuit, as compared with the conventional sense amplifier. Thus, it is possible to make the read speed of the ON cell signal faster and also possible to improve the performance of the semiconductor memory apparatus.

What is claimed is:

1. A semiconductor memory apparatus, comprising:
    a current detecting circuit detecting a current flowing through a memory cell to output a detecting signal from an output section of said current detecting circuit;
    an input signal generating circuit generating a first differential input signal obtained by amplifying said detecting signal to output from an output section of said input signal generating circuit;
    a reference current detecting circuit detecting a current flowing through a reference cell to output a reference detecting signal from an output section of said reference current detecting circuit;
    a reference input signal generating circuit generating a second differential input signal obtained by amplifying said reference detecting signal to output from an output section of said reference input signal generating circuit; and
    a differential amplifier circuit detecting a voltage difference between said first and second differential input signals.

2. The semiconductor memory apparatus according to claim 1, wherein said input signal generating circuit and said reference input signal generating circuit have a high current supply performance.

3. The semiconductor memory apparatus according to claim 1, wherein said input signal generating circuit transforms said detecting signal into said first differential input signal having a higher rising performance than said detecting signal, and said reference input signal generating circuit transforms said reference detecting signal into said second differential input signal having a higher rising performance than said reference detecting signal.

4. The semiconductor memory apparatus according to claim 1, further comprising:
    a plurality of first differential input signal generating circuits of N (N is an integer greater than or equal to 1, wherein each of said plurality of first differential input signal generating circuits includes said memory cell, said current detecting circuit, and said input signal generating circuit; and
    a plurality of said differential amplifier circuits of said N, and
    wherein one input sections of said plurality of differential amplifier circuits input a plurality of said first differential input signals outputted from a plurality of said input signal generating circuits, respectively and the other input sections of said plurality of differential amplifier circuits input said second differential input signal, and
    said semiconductor memory apparatus is a sense amplifier of said N channel.

5. The semiconductor memory apparatus according to claim 1, wherein said input signal generating circuit includes:
    a first transistor, a first electrode of said first transistor being connected to a first power supply and a second electrode of said first transistor being connected to said output section of said input signal generating circuit and a control electrode of said first transistor being connected to said output section of said current detecting circuit; and
    a second transistor, a first electrode of said second transistor being a second power supply and second and control electrodes of said second transistor being connected to said output section of said input signal generating circuit, and wherein said second electrode of said first transistor is connected to said second electrode of said second transistor.

6. The semiconductor memory apparatus according to claim 5, wherein said first transistor is a P-channel enhancement transistor and said first electrode is a source and said second electrode is a drain and said control electrode is a gate, and said second transistor is a N-channel enhancement transistor.

7. The semiconductor memory apparatus according to claim 5, wherein said reference input signal generating circuit includes:
    a third transistor, a first electrode of said transistor being connected to a third power supply and a second electrode of said transistor being connected to said output section of said reference input signal generating circuit and a control electrode of said third transistor being connected to said output section of said reference current detecting circuit; and
    a fourth transistor, a first electrode of said fourth transistor being connected to a fourth power supply and second and control electrodes of said fourth transistor being connected to said output section of said reference input signal generating circuit, and
    wherein said second electrode of said third transistor is connected to said second electrode of said fourth transistor.

8. The semiconductor memory apparatus according to claim 1, wherein said reference input signal generating circuit includes:
    a first transistor, a first electrode of said third transistor being connected to a first power supply and a second electrode of said third transistor being connected to said output section of said reference input signal generating circuit and a control electrode of said third transistor being connected to said output section of said reference current detecting circuit; and a second transistor, a first electrode of said fourth transistor being connected to a second power supply and second and control electrodes of said fourth transistor being connected to said output section of said reference input signal generating circuit, and wherein said second electrode of said third transistor is connected to said second electrode of fourth transistor.

9. The semiconductor memory apparatus according to claim 8, wherein said first transistor is a P-channel enhancement transistor and said first electrode is a source and said second electrode is a drain and said control electrode is a gate, and said second transistor is a N-channel enhancement transistor.

10. The semiconductor memory apparatus according to claim 1, wherein said input signal generating circuit includes:

a first transistor, a first electrode of said fifth transistor being connected to a first power supply and a second electrode of said first transistor being connected to said output section of said input signal generating circuit and a control electrode of said first transistor being connected to said output section of said current detecting circuit; and a second transistor, a first electrode of said sixth transistor being connected to a second power supply and a second electrodes of said second transistor being connected to said output section of said input signal generating circuit and a control electrode of said second transistor being connected to said output section of said current detecting circuit, and wherein said second electrode of said first transistor is connected to said second electrode of said second transistor.

11. The semiconductor memory apparatus according to claim 10, wherein said first transistor is a P-channel enhancement transistor and said first electrode is a source and said second electrode is a drain and said control electrode is a gate, and said second transistor is a N-channel enhancement transistor.

12. The semiconductor memory apparatus according to claim 1, wherein said reference input signal generating circuit includes:

a first transistor, a first electrode of said first transistor being connected to a first power supply and a second electrode of said first transistor being connected to said output section of said reference input signal generating circuit and a control electrode of said first transistor being connected to said output section of said reference current detecting circuit; and a second transistor, a first electrode of said second transistor being connected to a second power supply and a second electrode of said second transistor being connected to said output section of said reference input signal generating circuit and a control electrode of said second transistor being connected to said output section of said reference current detecting circuit, and wherein said second electrode of said first transistor is connected to said second electrode of said second transistor.

13. The semiconductor memory apparatus according to claim 12, wherein said first transistor is a P-channel enhancement transistor and said first electrode is a source and said second electrode is a drain and said control electrode is a gate, and said second transistor is a N-channel enhancement transistor.

14. The semiconductor memory apparatus according to claim 1, wherein said semiconductor memory apparatus is applied to a flash memory.

15. The semiconductor memory apparatus according to claim 1, wherein said current detecting circuit includes:

a first resistor, one end of said first resistor being connected to a first power supply and the other end of said first resistor being connected to said output section of said current detecting circuit;

a first transistor, a first electrode of said first transistor being connected to a first node connected to said memory cell and a second electrode of said first transistor being connected to said output section of said current detecting circuit; and a first inverter inputting a voltage of said first node to output to said control electrode of said first transistor.

16. The semiconductor memory apparatus according to claim 14, wherein said first transistor is a N-channel enhancement transistor.

17. The semiconductor memory apparatus according to claim 1, wherein said reference current detecting circuit includes:

first and second resistors provided in parallel, one end of each of said first and second resistors being connected to a first power supply and the other end of each of said first and second resistors being connected to said output section of said reference current detecting circuit;

a first transistor, a first electrode of said first transistor being connected to a first node connected to said reference cell and a second electrode of said first transistor being connected to said output section of said reference current detecting circuit; and a first inverter inputting a voltage of said first node to output to said control electrode of said first transistor.

18. The semiconductor memory apparatus according to claim 17, wherein said first transistor is a N-channel enhancement transistor.

19. The semiconductor memory apparatus according to claim 1, wherein said input signal generating circuit and said reference input signal generating circuit generate said first and second differential input signals such that a predetermined sense margin of said voltage difference is obtained at high speed.

20. The semiconductor memory apparatus according to claim 1, wherein said differential amplifier circuit inputs said first and second differential input signals through input signal lines from said input signal generating circuit and said reference input signal generating circuit, said input signal lines having parasitic capacities and wherein said input signal generating circuit and said reference input signal generating circuit have a high current supply performance such that said first and second differential input signals reach predetermined voltages at high speeds while charging said parasitic capacities.

* * * * *